United States Patent [19]

Mielke

[11] Patent Number: 5,068,602
[45] Date of Patent: Nov. 26, 1991

[54] DUT BOARD FOR A SEMICONDUCTOR DEVICE TESTER HAVING A RECONFIGURABLE COAXIAL INTERCONNECT GRID AND METHOD OF USING SAME

[75] Inventor: Joseph A. Mielke, Hillsboro, Oreg.

[73] Assignee: Tektronix, Inc., Beaverton, Oreg.

[21] Appl. No.: 579,423

[22] Filed: Sep. 7, 1990

[51] Int. Cl.⁵ .................... G01R 1/06; G01R 19/00
[52] U.S. Cl. ...................... 324/158 F; 324/158 R; 324/158 P
[58] Field of Search ............ 324/158 F, 158 P, 72.5; 439/482; 361/400, 401, 404, 409; 29/842

[56] References Cited

U.S. PATENT DOCUMENTS

| | | | |
|---|---|---|---|
| 4,099,120 | 7/1978 | Aksu | 324/158 P |
| 4,209,745 | 6/1980 | Hines | 324/158 F |
| 4,230,985 | 10/1980 | Matrone et al. | 324/158 F |
| 4,290,015 | 9/1981 | Labriola | 324/158 F |
| 4,967,147 | 10/1990 | Woods, Jr. et al. | 324/158 F |

*Primary Examiner*—Kenneth A. Wieder
*Assistant Examiner*—Vinh P. Nguyen
*Attorney, Agent, or Firm*—Dellett, Smith-Hill & Bedell

[57] ABSTRACT

An easily reconfigurable DUT board interconnection grid is electrically and mechanically reliable, has low noise and cross-talk, and permits high density mixed digital and analog devices to be tested. This DUT board includes a grounding block of conductive material that has an inner and outer array of holes and is in electrical contact with the circuit board ground. The arrays of holes correspond in shape and size to, and are in electrical contact with, underlying inner and outer array of conductive members in the circuit board. Each conductive member provides a pin in the center of the corresponding hole to make each hole a coaxial contact receptacle. The inner array of conductive members connects to the sockets or pads that receive the device-under-test on the DUT side of the circuit board to the other side of the circuit board where the grounding block resides. The coaxial contact receptacles of the inner array therefore present an interface to the DUT. The individual conductive members in the outer array are connected to each of the tester signals that the operator may wish to connect to a DUT. The coaxial contact receptacles of the outer array therefore present an interface to the signals of the tester. Coaxial jumper wires are then used to connect selected locations in the inner and outer arrays.

22 Claims, 5 Drawing Sheets

DUT BOARD FOR A SEMICONDUCTOR DEVICE TESTER HAVING A RECONFIGURABLE COAXIAL INTERCONNECT GRID AND METHOD OF USING SAME

BACKGROUND OF THE INVENTION

This invention relates to the field of semiconductor test systems, and more particularly to the field of device-under-test (DUT) board configuration interconnection.

Semiconductor test systems are used for testing integrated circuit (IC) devices to verify their performance characteristics. In a typical test system, the IC device is placed in a test fixture that is mounted on a device-under-test (DUT) board.

Semiconductor test systems are increasingly required to bring large numbers of high integrity digital and analog signals to bear on ever smaller and more dense device input and output pin arrangements. Such testers have drivers and receivers physically concentrated in the vicinity of a test head equipped with a DUT board. However, to interface with a variety of semiconductor devices, a means must be provided for switching between the fixed signal locations of the tester and the variable configurations of device pinouts. Reconfiguring this tester-to-device interface while attaining ever higher electrical performance is a major challenge for the engineers that design these testers.

While early semiconductor test systems were largely confined to testing either memories or digital logic or simple analog integrated circuits, current generations of testers frequently include the capability to do "mixed signal" testing. These mixed signal testers test integrated circuits that have digital and analog circuitry mixed together at a high level of density. Analog signal testing places an extra burden on the tester-to-DUT interface. As an additional burden on the tester-to-DUT interface, the analog frequencies and digital data rates involved keep moving higher and higher.

Low level analog signals that must be measured accurately and very high frequencies and data rates require a tester and tester-to-DUT interface with a very high level of signal fidelity, a very low level of noise, and a minimum of cross-talk.

One approach to meeting this need is to design dedicated DUT boards for each device type, but this is an approach that is both expensive and time consuming, putting an unacceptably long delay due to the required design cycle in the way of adequately testing a new device type. And, in the field of mixed analog and digital integrated circuits, each device type tends to have a different pin-out arrangement.

Using discrete jumper wires, either single conductor or coaxial cables, to reconfigure the tester-to-DUT interface is inconvenient and does not produce the required levels of signal integrity. Moreover, with high density inputs and outputs, numerous jumper wires, especially coaxial ones, eventually take up too much room and become harder to connect and disconnect. And, in the more complicated world of mixed signal testers, there are more types of circuitry residing on the DUT board. With more types of circuitry present, the average distance to the right type of circuitry for a particular pin on the device increases, further complicating the task of using discrete jumper wires to reconfigure the tester-to-DUT interface.

What is desired is an easily reconfigurable DUT board interconnection means that is electrically and mechanically reliable, that has low noise and cross-talk, and that permits high density mixed digital and analog devices to be tested.

SUMMARY OF THE INVENTION

Accordingly, a preferred embodiment of the present invention is a device-under-test board for a semiconductor device tester including a grounding grid of conductive material that has an inner array and an outer array of holes and is in electrical contact with the circuit board ground. The arrays of holes correspond in shape and size to, and are in electrical contact with, underlying inner and outer arrays of conductive members in the circuit board. Each conductive member provides a pin in the center of the corresponding hole to make each hole a coaxial contact receptacle. The inner array of conductive members connects the sockets or pads that receive the device-under-test on the DUT side of the circuit board to the other side of the circuit board where the grounding grid resides. The coaxial contact receptacles of the inner array therefore present an interface to the DUT. The individual conductive members in the outer array are connected to each of the tester signals that the operator may wish to connect to a DUT. The coaxial contact receptacles of the outer array therefore present an interface to the signals of the tester. By using small, high quality coaxial jumper wires, it is now possible to readily connect any tester signal to any device pin location by bridging selected locations in the inner and outer arrays. Unused inner array coaxial contact receptacles are filled in with grounding pieces to preserve the electrical integrity of the grounding block. Power for the device-under-test is supplied via one or more jumpers having one large power wire and one small sense wire connected to their center conductor. Decoupling capacitors can be placed between the power jumper center conductor and the nearest coaxial grounding piece.

It is an object of the present invention to provide an easily reconfigurable DUT board interconnection means that is electrically and mechanically reliable, that has low noise and cross-talk, and that permits high density parts to be tested.

The subject matter of the present invention is particularly pointed out and distinctly claimed in the concluding portion of this specification. However, both the organization and method of operation, together with further advantages and objects thereof, may best be understood by reference to the following detailed description and accompanying drawings.

BRIEF DESCRIPTION OF THE DRAWINGS

For a better understanding of the invention, and to show how it may be carried into effect, reference will now be made to the accompanying drawings in which.

DETAILED DESCRIPTION

Figure 1:
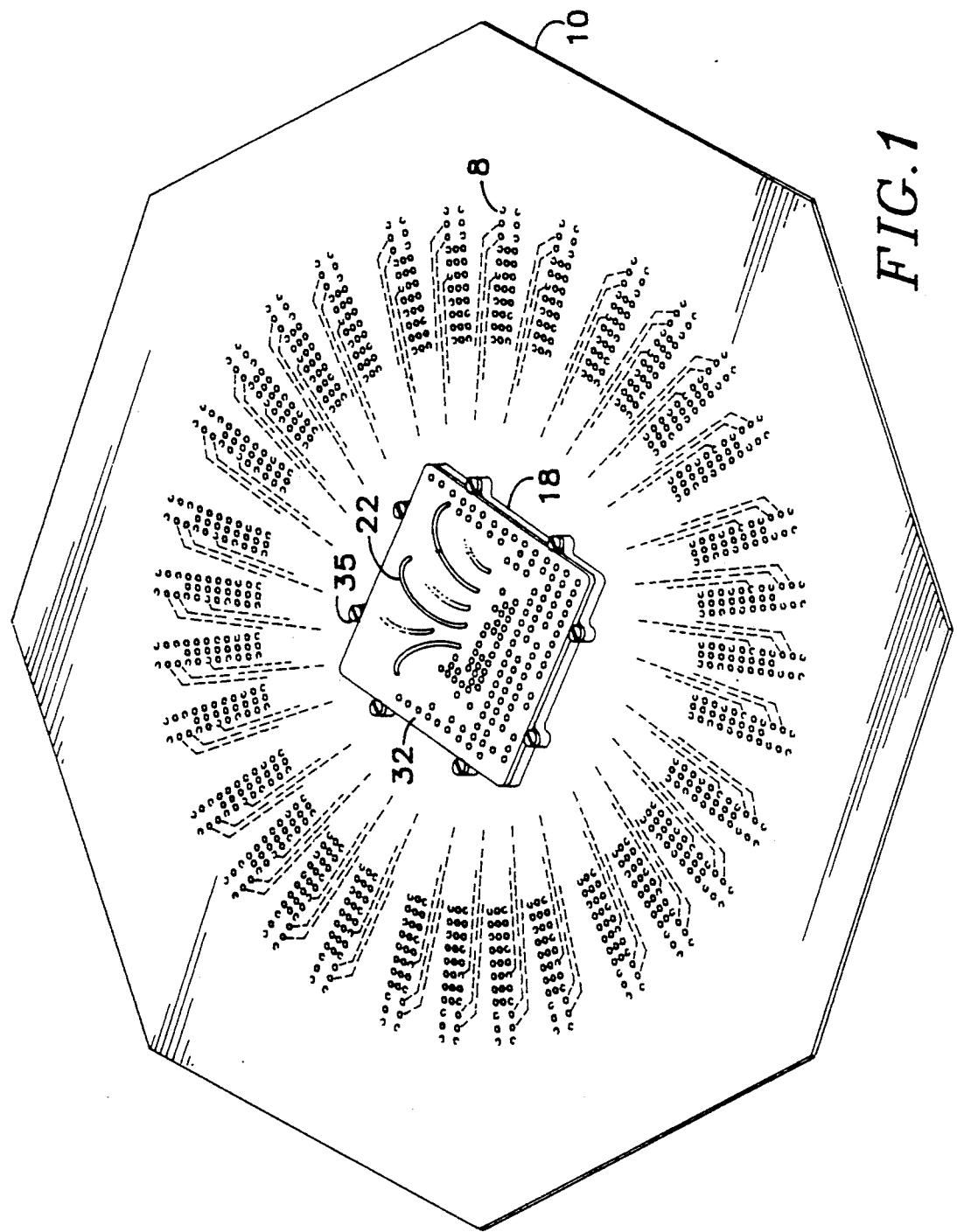
FIG. 1 is a perspective view of a DUT board for a semiconductor device tester having a reconfigurable coaxial interconnect grid according to the present invention.

Referring now to FIG. 1, a multilayer circuit board 10 has numerous rows of pads 8 arranged concentrically around a central region of the board for interfacing to the circuitry of a mixed signal tester. This circuitry includes waveform generators and waveform digitizers for generating and acquiring analog signals, and digital stimulation and acquisition circuitry for generating and acquiring digital signals. In a preferred embodiment, this multilayer board 10 has twelve layers of printed circuits for high density, with signal planes and ground planes alternating to maintain the controlled impedance nature of the signal paths. The circuitry within these layers provides for communication between circuit elements on the back of this circuit board, between those circuit elements and the rest of the tester, and between all of the foregoing and the central region of the circuit board. The central region of the circuit board 10 is provided with a grounding block 18 and a configuration plate 32.

Figure 2:
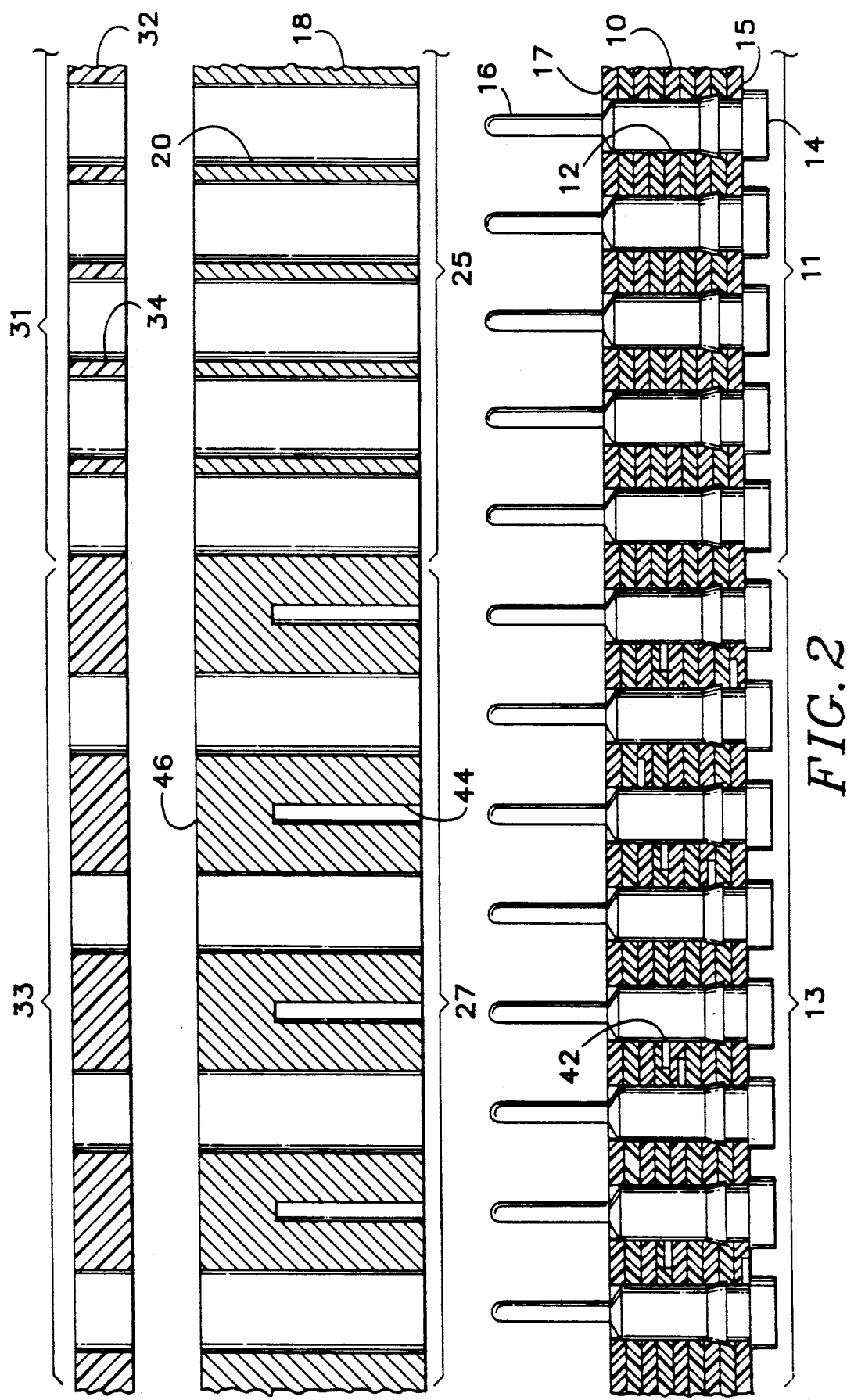
FIG 2 is an exploded cross-sectional view of a DUT board, a grounding block, and a configuration plate according to the present invention.

Referring now to FIG. 2, the central region of the multilayer circuit board 10 shown in FIG. 1 has been provided with two arrays of pin/sockets 12, an inner array 11 and an outer array 13. The pin/sockets 12 are press-fitted into through-holes in the circuit board 10. All of the sockets 14 of the pin/sockets 12 open to the DUT side 15 of the board 10 and all of the pins 16 of the pin/sockets 12 protrude from the back side 17 of the board 10.

Figure 3:
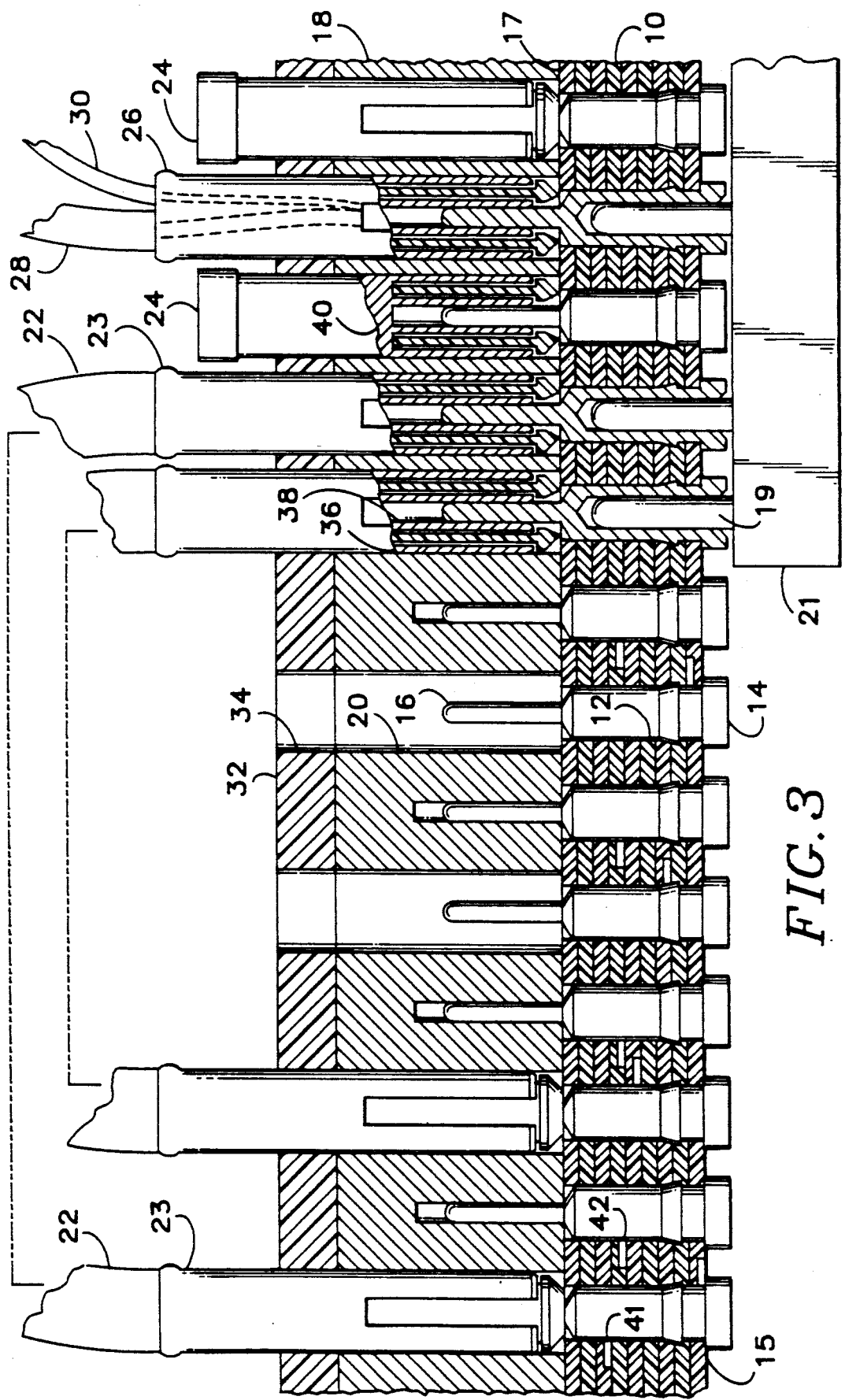
FIG. 3 is a cross-sectional view of a portion of the reconfigurable coaxial interconnect grid according to the present invention.

Referring now to FIG. 3, the inner array 11 of pin/sockets 12 is intended to receive the pins 19 of one of a variety of mixed analog and digital devices 21. Alternatively, the inner array 11 of pin/sockets 12 can receive the pins 19 of sockets 21 to receive DUTs, or the pins 19 of a handler contacter 21 supplied with DUTs, or the pins 19 of wafer prober interface 21 to receiver wafer DUTs. Presently, inter-center distances within this array are 0.1 inch (2.54 mm), although as devices shift to ever closer lead spacings, more dense arrays will indubitably be required.

The pin/sockets 12 are model number BU-STGG-8631-VLI from McKenzie Technology, Inc., of Fremont, Calif. The sockets 14 of these pin/sockets 12 are very low insertion force and intended to receive pins 19 of all standard SIP, DIP, and PGA devices (or their sockets or handler contacters, etc.) having 0.10 inch (2.54 mm) lead spacings. Alternatively, by changing the pin/sockets 12 to pin/through-hole/pads, surface mount devices can be accommodated.

The pin/sockets 12 of the outer array 13 are in electrical contact with the signal runs 41 within the multiple layers of the circuit board 10, providing communication between circuit elements on the circuit board 10 and in the tester and the pins 16 of the outer array 13. Thus, signals from the tester are made available at the pins 16 of the outer array 13. In alternate rows of the outer array 13 the connection run 42 is connected to the ground plane of the circuit board 10, so that every pin 16 of every other row of the outer array 13 is grounded.

Affixed to the back side 17 of circuit board 10, e.g. with screws or bolts 35, (FIG. 1), is a grounding block 18 of conductive material, e.g., gold coated metal. This grounding block 18 defines two arrays of holes (FIG. 2), an inner array 25 and an outer array 27, that correspond to and align with the inner array 11 and outer array 13 of pin/sockets 12 on the circuit board 10. The pins 16 of the pin/sockets 12 in the centers of the holes 20 turn the holes into coaxial contact receptacles. In the case of the outer holes array 27, every alternate row and column remains substantially filled with metal 46 defining smaller holes 44 instead of holes 20. These smaller holes 44 are suitable for receiving the pins 16 of every other row and column of the pin/sockets 12 of the outer 13. Thus, the grounded rows and columns of the outer array 13 of pin/sockets 12 in the circuit board 13 are in direct contact with the grounding block 18 of conductive material.; This provides maximum shielding and increases the electrical integrity of the grounding block 18.

With the arrays 25, 27 of holes 20 in the grounding block 18 aligned with the arrays 11, 13 of pin/sockets 12 on the circuit board, the protruding pins 16 and corresponding holes 20 together comprise a socket, or fully functional coaxial contact receptacle, suitable for receiving a subminiature coaxial contact. The holes 20 have an inside diameter of 0.09 inches (2.29 mm), and that is the same as the outside diameter of an inserted coaxial contact suitable for mating with this socket.

The DUT board of the present invention, as described so far, has tester circuitry connected to the outer array 13 of pin/sockets 12, and, if it has a device 21 attached, has the device 21 I/O pins 19 connected to a subset of the sockets 14 of the inner array 11 of pin/sockets 12. The coaxial contact receptacles of the outer array 27 of holes are then an interface to the tester circuitry, while the coaxial contact connectors of the inner array of holes 25 are an interface to the pins 19 of the device 21.

Figure 4:
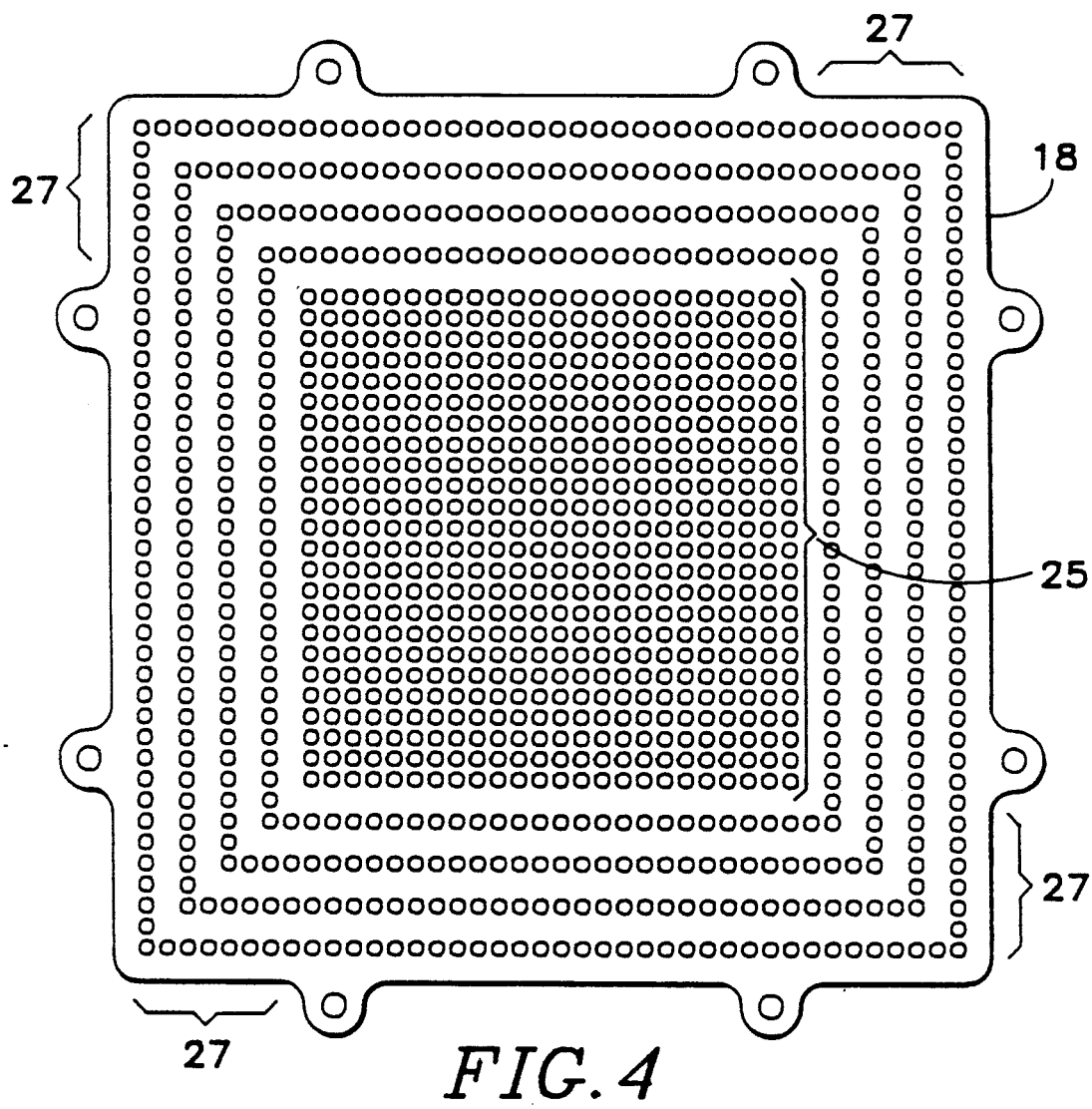
FIG. 4 is a top plan view of the grounding block of the present invention showing the inner array and outer array of holes that pass through it.

Referring now to FIG. 4, in an embodiment built to accommodate devices 21 with up to 512 active pins 19 to be tested, the inner array of holes 25 is 24 by 24, for a total of 576 holes. The tester only has 512 driver/receiver channels to apply stimulus or acquire data, but the device could have up to a total of 576 pins. The lines of holes of the outer array 27 of this same embodiment are each two longer than the next line in, but every other row is grounded and all that is seen in this top view of the grounding block 18 is the metal layer 42 (FIG. 2). Therefore, the active lines of holes are each four longer moving away from the inner array. That is, the lines of holes in the outer array 27 are 28, 32, 36, and 40 holes long, providing a total of 528 holes in the outer array. 528 points in the outer array is therefore more than adequate to apply signals from the tester's 512 input/output channels.

Coaxial jumper wires 22 equipped with coaxial contacts 23 at each end may now be used to interconnect in any manner desired the interface to the tester (outer coaxial contact receptacles array 27) with the interface to the device 21 (inner coaxial contact receptacles array 25). These coaxial jumper wires 22 should have a length that is sufficient to allow them to connect the worst case distance between points in the inner array 11 and the outer array 13. For the 24×24 and 40×40 array size grounding block 18 on 0.10 inch (2.54 mm) centers, a coaxial jumper length of about five inches (12.7 cm) has proven to be satisfactory.

In a preferred embodiment, these jumper wires have very short contacts, such as Subminiature Contacts from AMP, Inc. having part number 51563-2, modified to be only 0.450 inches (11.43 mm) long, instead of the normal short pin length of 0.892 inches (22.66 mm). This contact was also modified to accommodate a smaller coaxial cable C06C029 made by W. L. Gore & Associates, Inc. This cable has superior electrical characteristics despite its small size, at least in part because its shield is made of an Expanded Teflon TM that is a better dielectric than standard Teflon TM. An alternative, embodiment utilizes semi-rigid coaxial cable. While this cable is less flexible, it has even better electrical characteristics.

To minimize noise and cross-talk and otherwise preserve the electrical integrity of the environment in the vicinity of the grounding block 18, any unused receptacles in the inner coaxial contact receptacles array 25 are shorted out using grounding pieces 24. Whereas in normal contacts 23 the inner conductor 38 and outer conductor 36 are insulated from each other, in the grounding pieces 24 these conductors are shorted together by additional conductor 40. Thus, unused pin/sockets 12 in the inner array 11 are shorted to the grounding block 18. Unused pin/sockets 14 in the outer array 13 may be used to connect additional circuitry to the circuit board 10 for prototyping or modifications.

Power is supplied to appropriate pins 19 of the device 21 by power jumpers 26. Power jumper 26 has an outer conductor that only electrically connects to the grounding block 18. Its inner conductor is connected to a large power wire 28 and a smaller sense wire 30 which provides an indication to the power supply of how much voltage is reaching the load after any IR drop along the main power wire 28. Decoupling capacitors can be placed between the power jumper (26) center conductor and the nearest coaxial grounding piece (24).

Since the size of the inner array 23 in a preferred embodiment is 24×24 to accommodate devices 21 with up to 576 pins 19, once a user has invested the time and effort to produce a desired mapping between the outer coaxial contact receptacles array 27 and the inner coaxial contact receptacles array 25 and added all of the necessary power jumpers 26 and grounding pieces 24, it would be highly desirable to be able to preserve that setup for future reference. Accordingly, all of these connections can be made through a configuration plate 32 made of plastic or other suitable material and having an inner 31 and outer 33 array of contact passages 34 corresponding in location to the inner 25 and outer 27 arrays of coaxial contact receptacles 20. The configuration plate 32 should be made of a material and have passage with a dimension that will accommodate the contacts 23 of the jumpers 22 and snugly hold them in place. All of the connections and the configuration plate 32 can then be lifted free of the grounding block 18 and stored for future easy use. When a configuration is to be saved and this configuration plate is being used, the semi-rigid coaxial cable mentioned above is especially suitable.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention. For example, different sizes or shapes of contacts, or different spacings between centers in the array, could be used to make a DUT board for devices with such differences.

Figure 5:
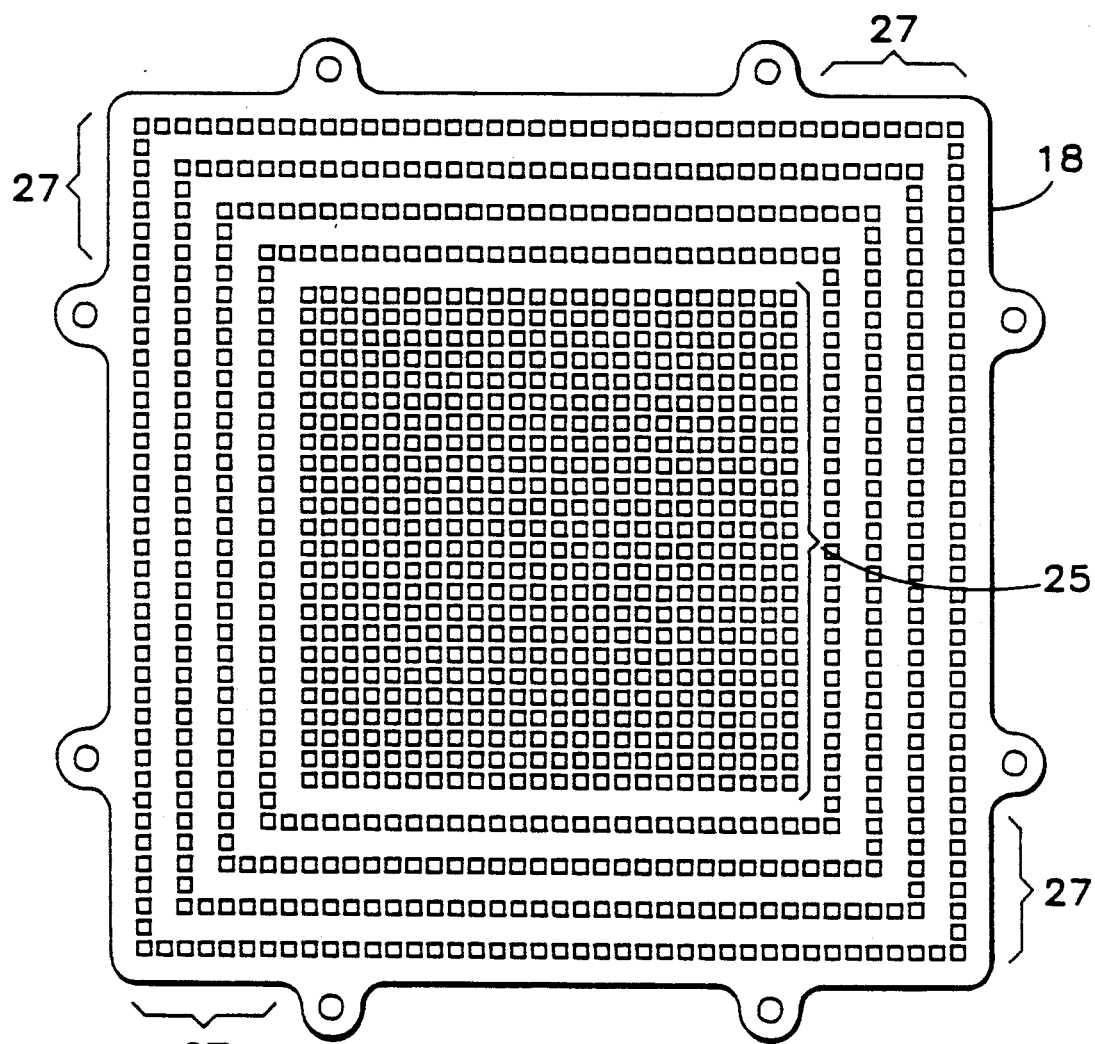
FIG. 5 is a top plan view similar to FIG. 4, but with square holes.

Furthermore, alternative constructions are envisioned in which conductive members other that the pin/sockets 12 are used to provide electrical connection from the device side 15 of the circuit board 10 to the grounding block side 17, and the pins 16 needed to mate with the internal conductor of the contacts 23 of the coaxial jumper wires 22 are provided by an intermediate layer locally in electrical contact with the ends of the conductive members on the grounding block (back) side 17 of the circuit board 10. Alternatively, the grounding block 18 might be provided with insulated pins 16 at the circuit board side of the holes 20, with the back end of the pins in electrical contact with the corresponding conductive members. As shown in FIG. 5, the holes 20 can be made square to accommodate square coaxial contacts 23. The claims that follow are therefore intended to cover all such alternatives.

I claim:

1. A device-under-test board for a semiconductor device tester comprising:
    a circuit board containing a plurality of conductive paths comprising signal paths and a ground path;
    an inner array of conductive members disposed within the circuit board, with a first end of the conductive members oriented toward a first surface of the circuit board and arranged to engage the contacts of a semiconductor device, and with a second end of the conductive members oriented toward a second surface of the circuit board;
    an outer array of conductive members disposed within the circuit board around the outside of the inner array of conductive members, with a first end of the conductive members oriented toward the first surface of the circuit board, and with the second end of the conductive members oriented toward the second surface of the circuit board, and with each of the conductive members of the outer array being in electrical contact with one of the plurality of conductive paths;
    a grounding block of conductive material defining inner and outer arrays of holes corresponding in location to the inner and outer arrays of conductive members, the grounding block being adjacent to the second surface of the circuit board such that the holes each align with one of the conductive members; and
    means for electrically connecting the grounding block to the ground path.

2. A device-under-test board according to claim 1 wherein the conductive members comprise pin/sockets with a socket comprising the first end and a pin comprising the second end.

3. A device-under-test board according to claim 2 further comprising:
    a plurality of jumper wires having a contact at each end, the contacts having a size compatible with the holes of the grounding block and the pins of the pin/sockets, for connecting between a selected location in the outer array of holes and a selected location in the inner array of holes.

4. A device-under-test board according to claim 3 further comprising:
    a plurality of grounding pieces having a size compatible with the holes of the grounding block and the pins of the pin/sockets, for shorting together said pins and holes.

5. A device-under-test board according to claim 3 further comprising a power jumper.

6. A device-under-test board according to claim 5 wherein the power jumper comprises:
   a contact having a size compatible with the holes of the grounding block and the pins of the pin/sockets;
   a large power wire coupled to a center conductor of the contact; and
   a small sense wire coupled to the center conductor of the contact.

7. A device-under-test board according to claim 3 further comprising:
   a configuration plate defining inner and outer arrays of contact passages corresponding in location to the inner and outer arrays of holes defined by the grounding block so that the contacts of the jumper wires pass through the contact passages when the jumper wires are used for connecting between the selected location in the outer array of holes and the selected location in the inner array of holes.

8. A device-under-test board according to claim 1 wherein the conductive members comprise through-hole/pads at the first end.

9. A device-under-test board according to claim 1 wherein the holes defined by the grounding block are round.

10. A device-under-test board according to claim 1 wherein the holes defined by the grounding block are square.

11. A device-under-test board according to claim 1 wherein the means for electrically connecting comprises runs within the circuit board connecting a set of the conductive paths to the ground path.

12. A method for making a reconfigurable device-under-test board for a semiconductor device tester comprising the steps of:
   obtaining a circuit board containing a plurality of conductive paths comprising signal paths and a ground path;
   disposing within the circuit board an inner array of conductive members, with a first end of the conductive members oriented toward a first surface of the circuit board and arranged to engage the contacts of a semiconductor device, and with a second end of the conductive members oriented toward a second surface of the circuit board;
   also disposing an outer array of conductive members around the outside of the inner array of conductive members, with a first end of the conductive members oriented toward the first surface of the circuit board, and with the second end of the conductive members oriented toward the second surface of the circuit board, and with each of the conductive members of the outer array being in electrical contact with one of the plurality of conductive paths;
   affixing to the second surface of the circuit board a grounding block of conductive material defining inner and outer arrays of holes corresponding in location to the inner and outer arrays of conductive members, such that the holes each align with one of the conductive members; and
   connecting the grounding block to the ground path.

13. A method according to claim 12 wherein the conductive members comprise pin/sockets with a socket comprising the first end and a pin comprising the second end.

14. A method according to claim 13 further comprising the step of:
   connecting a plurality of jumper wires, each having a contact at each end, the contacts having a size compatible with the holes of the grounding block and the pins of the pin/sockets, between a selected location in the outer array of holes and a selected location in the inner array of holes.

15. A method according to claim 14 further comprising the step of:
   placing a plurality of grounding pieces having a size compatible with the holes of the grounding block and the pins of the pin/sockets and shorting together said pins and holes in unused coaxial receptacles in the inner array.

16. A method according to claim 14 further comprising the step of using a power jumper to supply power to an appropriate hole of the inner array.

17. A method according to claim 16 wherein the power jumper comprises:
   a contact having a size compatible with the holes of the grounding block and the pins of the pin/sockets;
   a large power wire coupled to a center conductor of the contact; and
   a small sense wire coupled to the center conductor of the contact.

18. A method according to claim 14 further comprising the step of:
   preserving a particular configuration by using a configuration plate defining inner and outer arrays of contact passages corresponding in location to the inner and outer arrays of holes defined by the grounding block.

19. A method according to claim 12 wherein the conductive members comprise through-hole/pads at the first end.

20. A method according to claim 12 wherein the holes defined by the grounding block are round.

21. A method according to claim 12 wherein the holes defined by the grounding block are square.

22. A method according to claim 12 wherein the connecting step comprises the step of making electrical contact between a set of the conductive paths and the ground path.

* * * * *